(12) United States Patent
Oldenbeuving et al.

(10) Patent No.: US 11,320,587 B2
(45) Date of Patent: May 3, 2022

(54) PLANAR LIGHTWAVE CIRCUITS (PLCS) EXHIBITING CONTROLLABLE TRANSMISSIVITY / REFLECTIVITY

(71) Applicant: LioniX International BV, Enschede (NL)

(72) Inventors: Ruud Michiel Oldenbeuving, Enschede (NL); Chris Gerardus Hermanus Roeloffzen, Weerselo (NL); Roelof Bernardus Timens, Hengelo (NL); Jörn Philipp Epping, Münster (DE); Ilka Dove, Schüttorf (DE); Dimitri Geskus, Enschede (NL)

(73) Assignee: LioniX International BV, Enschede (NL)

( * ) Notice: Subject to any disclaimer, the term of this patent is extended or adjusted under 35 U.S.C. 154(b) by 0 days.

(21) Appl. No.: 16/459,091

(22) Filed: Jul. 1, 2019

(65) Prior Publication Data

US 2019/0324198 A1    Oct. 24, 2019

Related U.S. Application Data

(63) Continuation-in-part of application No. 15/332,745, filed on Oct. 24, 2016, now Pat. No. 10,338,318.
(Continued)

(51) Int. Cl.
*G02B 6/122* (2006.01)
*G02F 1/035* (2006.01)
*G02B 6/12* (2006.01)

(52) U.S. Cl.
CPC ............. *G02B 6/122* (2013.01); *G02F 1/035* (2013.01); *G02B 2006/12097* (2013.01)

(58) Field of Classification Search
CPC ............ G02B 6/29343; G02B 6/29352; G02B 6/29395; G02F 1/3132
See application file for complete search history.

(56) References Cited

U.S. PATENT DOCUMENTS 5,870,417 A * 2/1999 Verdiell ............. G02B 6/12007
372/32
6,289,151 B1 * 9/2001 Kazarinov ............. B82Y 20/00
385/24
(Continued)

FOREIGN PATENT DOCUMENTS

CN      1819379 A    8/2006
CN    102324983 A    1/2012
(Continued)

OTHER PUBLICATIONS

Chen et al., "Compact bandwidth-tunable microring resonators", Optics Letters, vol. 32, No. 22, Nov. 15, 2007, pp. 3361-3364.
(Continued)

*Primary Examiner* — Thomas A Hollweg
*Assistant Examiner* — Mary A El-Shammaa
(74) *Attorney, Agent, or Firm* — Kaplan Breyer Schwarz, LLP

(57) ABSTRACT

Aspects of the present disclosure describe planar lightwave circuit systems, methods and structures including a resonant mirror assembly having cascaded resonators that provide or otherwise facilitate the control of the transmissivity/reflectivity of a planar lightwave circuit (PLC)—or portion thereof—over a range of 0% to substantially 100%.

6 Claims, 10 Drawing Sheets

Related U.S. Application Data

(60) Provisional application No. 62/245,798, filed on Oct. 23, 2015.

(56) References Cited

U.S. PATENT DOCUMENTS

| | | | |
|---|---|---|---|
| 6,522,812 B1* | 2/2003 | Nikonov | G02B 6/12004 385/37 |
| 7,565,045 B2 | 7/2009 | Suzuki | |
| 9,373,936 B1* | 6/2016 | Kanskar | H01S 5/18319 |
| 9,577,409 B1* | 2/2017 | Connolly | H01S 5/141 |
| 9,812,845 B1* | 11/2017 | Lee | H01S 5/021 |
| 2004/0156580 A1* | 8/2004 | Baumann | G02B 6/122 385/16 |
| 2009/0208209 A1* | 8/2009 | Ng | G02B 6/29383 398/49 |
| 2010/0067843 A1 | 3/2010 | Little | |
| 2010/0183312 A1* | 7/2010 | Bolla | G02B 6/29395 398/85 |
| 2010/0196014 A1* | 8/2010 | Bolla | G02B 6/29395 398/141 |
| 2010/0209038 A1 | 8/2010 | Popovic et al. | |
| 2011/0116802 A1* | 5/2011 | Kamei | G02B 6/29398 398/87 |
| 2013/0243362 A1* | 9/2013 | Van Orden | H01S 3/0637 385/1 |
| 2014/0023098 A1* | 1/2014 | Clarkson | H01S 3/07 372/3 |
| 2014/0270826 A1* | 9/2014 | Kubo | G03G 15/0907 399/48 |
| 2014/0279930 A1* | 9/2014 | Gupta | G06F 11/1471 707/683 |
| 2015/0109661 A1 | 4/2015 | Li et al. | |
| 2019/0324198 A1* | 10/2019 | Oldenbeuving | H01S 5/142 |

FOREIGN PATENT DOCUMENTS

| | | |
|---|---|---|
| KR | 10-2006-0092348 | 8/2006 |
| WO | 2011/108617 A1 | 9/2011 |

OTHER PUBLICATIONS

"International Search Report and the Written Opinion", International Patent Application PCT/IB2016/001898, Completed Jun. 7, 2017, 19 pp.

Gao et al., "Analysis of Optical Reflector Based on Circular Coupled Microring Resonators", IEEE Publication, ICTON 2009, pp. 1-4.

Gao et al., On-Chip Reflectivity-Tunable Single Wavelength Reflector, IEEE Photonics Technology Letters, Sep. 15, 2015, pp. 1938-1941, vol. 27, No. 18.

Kobayashi Naoki et al, "Silicon Photonic Hybrid Ring-Filter External Cavity Wavelength Tunable Lasers" Journal of Lightwave Technology, IEEE, USA, Mar. 15, 2015, XP011575212, pp. 1241-1246, vol. 33, Issue No. 6.

Little et al., Tunable Bandwidth Microring Resonator Filters, ECOC 2008, Sep. 21-25, 2 pp., 2008, vol. 4, Published: Brussels Belgium.

Notice of Allowance and Fees Due (PTOL-85) received for U.S. Appl. No. 15/332,745, dated Feb. 15, 2019, 8 pages.

Officer: Jazqueline Van Ekelenburg, "Invitation to Pay Additional Fees, and Where Applicable, Protest Fees", International Patent Application No. PCT/IB2016/001898, dated Apr. 6, 2017, 7 pp.

Otto Schwelb, Microring Resonator Based Photonic Circuits: Analysis and Design, Telsiks 2007, Serbia, Nis, Sep. 26-28, 2007, pp. 187-194.

Patrick Diot, Office Action (Communication pursuant to Article 94(3) EPC) dated Nov. 22, 2019 in EP Patent Application No. 16834097.4.

Scheuer Jacob et al, "All optically tunable wavelength-selective reflector consisting of coupled polymeric microring resonators" Applied Physics Letters, A 1 P Publishing LLC, US, Dec. 13, 2005, XP01 2076920, pp. 251102-251102, vol. 87, Issue No. 25.

Srinivasan S. et al, "Coupled-Ring-Resonator-Mirror-Based Heterogeneous III-V Silicon Tunable L", IEEE Photonics Journal, IEEE, USA, Jun. 1, 2015, XP01 1582662, pp. 1-8, vol. 7/ Issue No. 3.

Wesley D. Sacher et al., "Binary phase-shill keying by coupling modulation of microring", Aug. 13, 2014, 8 pp., vol. 22, No. 17, Publisher: Optics Express.

Annex to the communication dated Sep. 10, 2020 for EP Application No. 16834097.

Office Action and English Translation thereof dated Dec. 10, 2020 in counterpart Chinese Patent Application No. 201680070560.1.

Communication under Rule 71(3) EPC dated May 25, 2021 for EP Application No. 16834097.4.

Office Action issued in Chinese patent application No. 201680070560.1, dated May 21, 2021, 7 pp. w/ translation.

Office Action and English Translation thereof issued in Korean Patent Application No. 10-2018-7014549 dated Dec. 28, 2021.

* cited by examiner

PLANAR LIGHTWAVE CIRCUITS (PLCS) EXHIBITING CONTROLLABLE TRANSMISSIVITY / REFLECTIVITY

CROSS REFERENCE TO RELATED APPLICATION

This application is a divisional and a continuation-in-part application of U.S. patent application Ser. No. 15/332,745 filed 24 Oct. 2016 which in turn claims the benefit of U.S. patent application Ser. No. U.S. Provisional Patent Application Ser. No. 62/245,798 filed Oct. 23, 2015, both of which are incorporated by reference as if set forth at length herein.

TECHNICAL FIELD

This disclosure relates generally to photonic integrated circuit (PIC) technologies and more particularly to planar lightwave circuits (PLCs) exhibiting controllable transmissivity/reflectivity.

BACKGROUND

As is known, PLCs have found widespread applicability in a number of technological arts including communications and biomedical instrumentation—among others. In a number of such applications, controlling light that propagates through the PLC (i.e., transmissivity/reflectivity of the PLC) is of critical importance. Given this importance, systems, methods structures that provide or otherwise facilitate control of the transmissivity/reflectivity of a PLC would represent a welcome addition to the art.

SUMMARY

An advance in the art is made according to aspects of the present disclosure which describes systems, methods and structures that include a resonant mirror assembly having a number of cascaded resonators that provide or otherwise facilitate the control of the transmissivity/reflectivity of a planar lightwave circuit (PLC)—or portion thereof—over a range of 0% to substantially 100%.

Viewed from a first aspect, the present disclosure describes a planar lightwave circuit comprising an input port; an output port; and a resonant mirror assembly optically coupling the input port to the output port, the resonant mirror assembly including a number of cascaded optical resonators, each optical resonator exhibiting a pair of coupling coefficients, wherein one of the coupling coefficients of at least one of the plurality of resonators is different in value from all the other coupling coefficients. Of particular advantage, such difference may be achieved at the time of fabrication and/or during operation of the PLC.

Viewed from another generalized aspect the present disclosure is directed to a planar lightwave circuit comprising an input waveguide; an output waveguide; n optical resonators where n>=3; n+1 bus waveguides, each of bus waveguides having a first end and a second end; a first coupler optically coupling the input waveguide to the first end of the first one of the n bus waveguides and to the first end of the nth of the n bus waveguides; a second coupler optically coupling the output waveguide to the second end of the first one of the n bus waveguides and to the second end of another one of the n bus waveguides; wherein each of the n optical resonators are optically coupled to at least two of the bus waveguides, each of the resonator bus couplings being defined by a coefficient K; and wherein at least one of the coefficients is different in value from all of the others.

Viewed from still another generalized aspect of the present disclosure is directed to a lightwave circuit—i.e., lasers—including an energy source—i.e., a pump or pump source—a gain medium or laser medium, and mirrors that form an optical resonator wherein a plurality of the optical resonators are configured in parallel and share a common resonant mirror assembly positioned at one (i.e., distal) end of the optical resonators. In sharp contrast to the prior art, such multiple-gain lasers according to the present disclosure allows for higher output power than the prior art. In further contrast to the prior art, systems, and structures according to the present disclosure allow for the construction of tunable, narrow linewidth, laser. By increasing the number of gain sections—according to aspects of the present disclosure—a laser having increased output power while maintaining tunability and narrow linewidth. According to aspects of the present disclosure, such is obtained advantageously—and surprisingly—through the use of a single, common, frequency selective mirror that is shared and used by all the gain sections in the structure. In this inventive manner, the gain sections are combined in parallel into a single, overall laser structure.

As we shall show and describe and as will be readily appreciated by those skilled in the art, by increasing the number of gain sections in parallel and sharing a mirror assembly, the more gain sections added the more power may be produced. Using the same mirror for each cavity allows for extremely low linewidths with high output power while still exhibiting tunability.

BRIEF DESCRIPTION OF THE DRAWING

A more complete understanding of the present disclosure may be realized by reference to the accompanying drawing in which.

Figure 1:
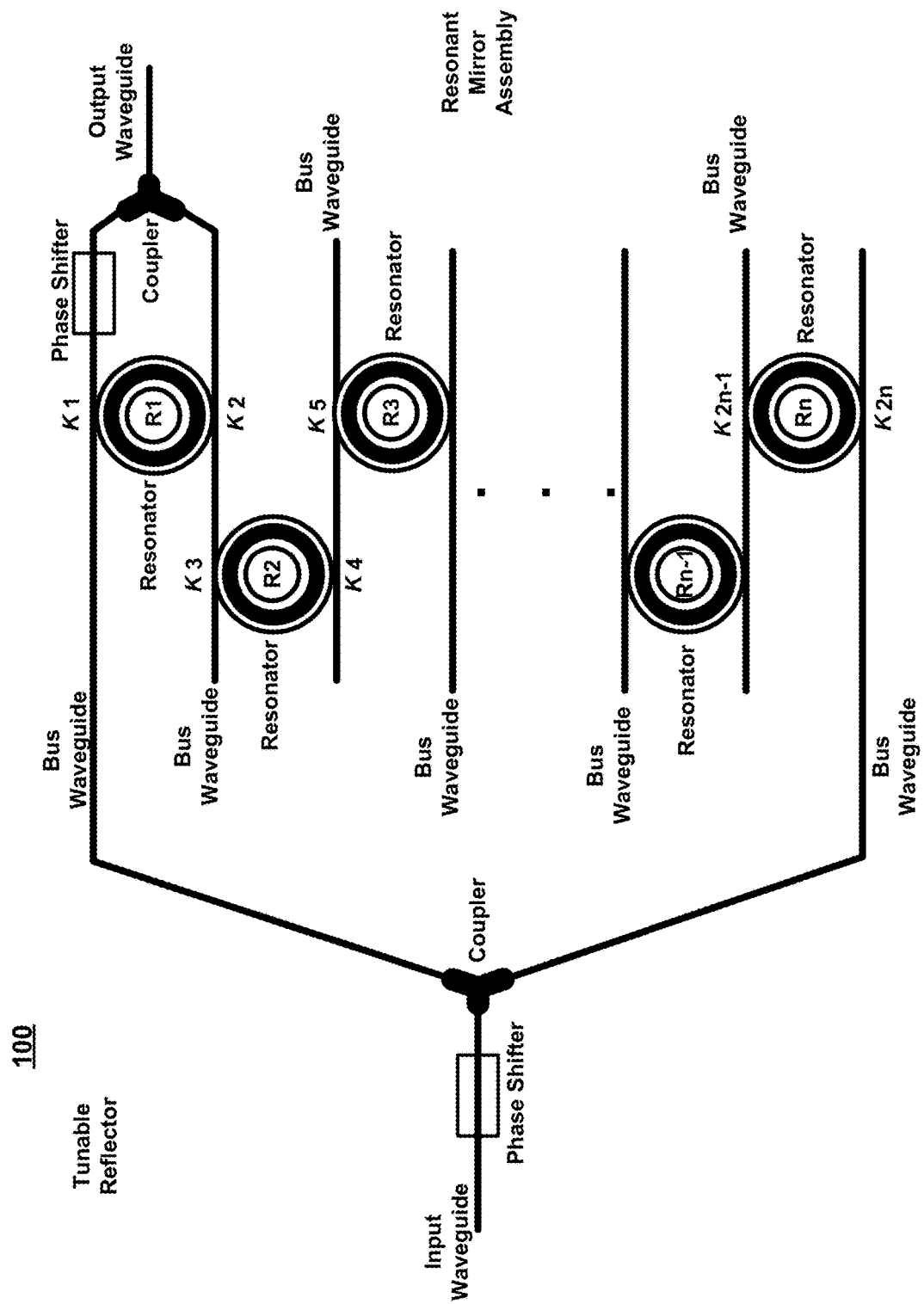
FIG. 1 depicts a schematic diagram of an illustrative, generalized PLC tunable reflector including n cascaded tunable resonators according to an aspect of the present disclosure.

The illustrative embodiments are described more fully by the Figures and detailed description. Inventions according to this disclosure may, however, be embodied in various forms and are not limited to specific or illustrative embodiments described in the Figures and detailed description

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGS. comprising the drawing are not drawn to scale.

Turning now to FIG. 1, there is shown a schematic diagram depicting a generalized, PLC tunable reflector including cascaded tunable resonators according to an aspect of the present disclosure. As may be observed from that FIG. 1, the tunable reflector includes an input waveguide and an output waveguide optically coupled—through the effect of a pair of couplers—to a series of bus waveguides which in turn are coupled to one or more resonator structures. As may be appreciated by those skilled in the art, this "cascaded resonator structure" including bus waveguides and coupled resonators operatively form a resonant mirror assembly which advantageously permits the selective control of the transmissivity/reflectivity of the overall tunable reflector structure with regard to light traversing the tunable reflector structure.

Of particular significance to those skilled in the art is that the structure(s) shown in FIG. 1 may advantageously be fabricated from any of a variety of known materials, techniques and/or processes. Note that while the resonators shown in the Figure(s) are schematically shown as ring resonators, those skilled in the art will readily appreciate that any of a variety of known structures providing resonator functionality including ring, racetrack, solid disk, Bragg grating, Mach-Zehnder, etc. may be employed—including different individual (mixed) ones in a particular reflector structure. Similarly, while the couplers are shown in the Figure(s) as "Y" couplers, this disclosure is not so limited and therefore alternative coupler structures may likewise be advantageously employed. Additionally, particular waveguide structures may likewise be any of a variety known in the art as suitable for PLC applications including—but not limited to waveguides having a single-layer core of silicon nitride or TRIPLEX™ waveguides that have a multi-layer core comprising a layer of silicon nitride disposed on a layer of silicon oxide that is disposed on a layer of silicon nitride, or a central core of silicon oxide that is encased in silicon nitride. Examples of TRIPLEX™ waveguides suitable for use in accordance with the present disclosure are described in U.S. Pat. Nos. 7,146,087 and 7,142,759, each of which is incorporated by reference as if set forth at length herein. Finally—and as we shall discuss in more detail later—we note that controllability of the overall transmissivity/reflectivity of structures according to the present disclosure and as generally shown in FIG. 1 may advantageously be achieved through the effect of techniques and/or structures that affect the resonant structures characteristics including heat, stress, etc. More specifically, phase shifters shown in the Figure(s) may be constructed from any of a variety of known structures/techniques/materials that are compatible with the particular structure(s) employed and produce the desired amount of heat, stress, etc., that affects characteristics in a desired manner. Note further that the phase shifters shown as part of input waveguides or bus waveguides are optionally added to the structures disclosed herein as desired and/or necessary to achieve desired functionality.

Figure 2A:
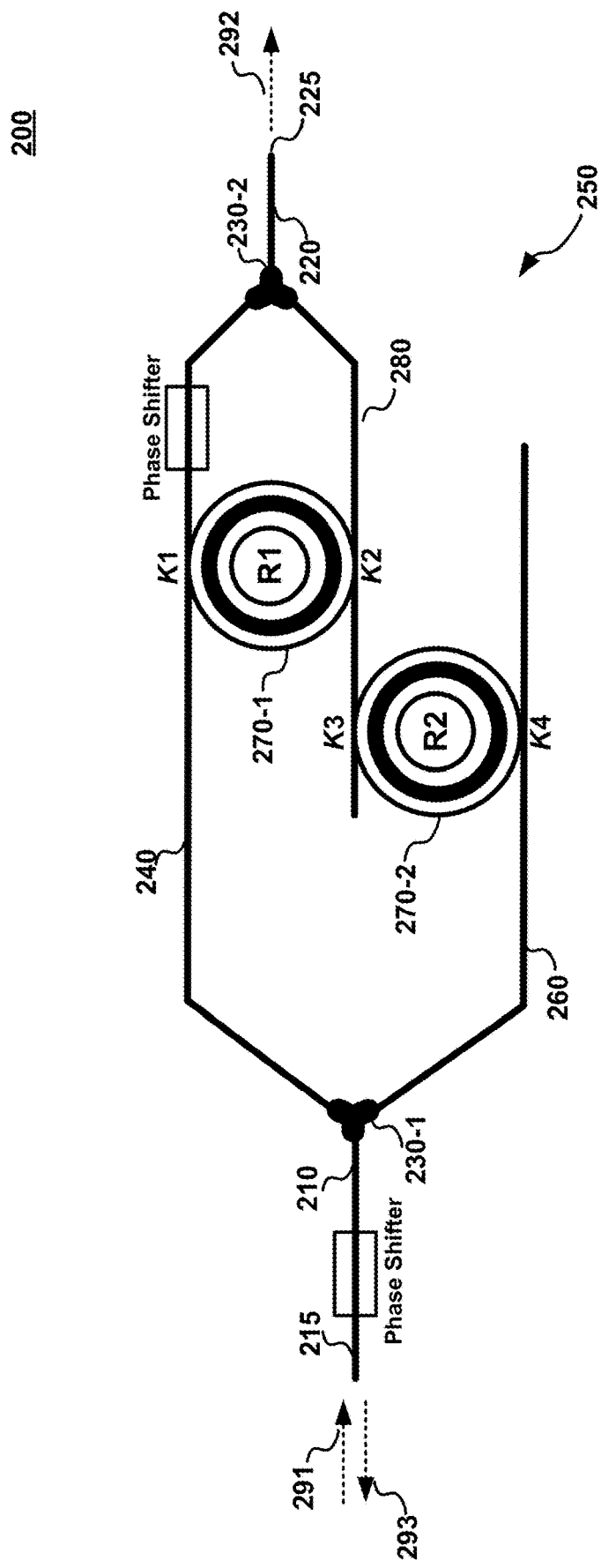
FIG. 2(A) depicts a schematic diagram of an illustrative PLC tunable reflector including two cascaded tunable resonators according to an aspect of the present disclosure.
Figure 2B:
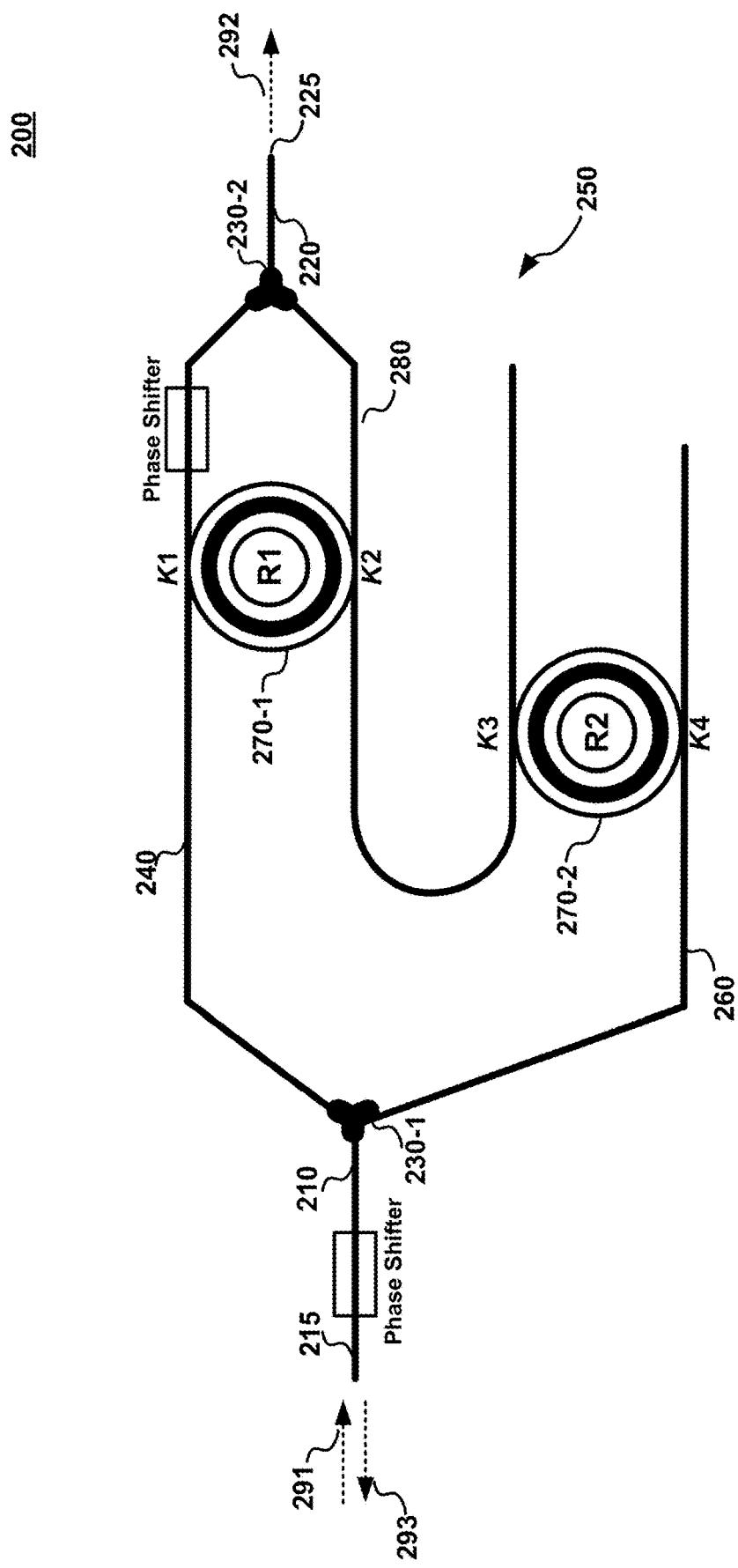
FIG. 2(B) depicts a schematic diagram of an another illustrative PLC tunable reflector including two cascaded tunable resonators according to an aspect of the present disclosure.

With simultaneous reference now to FIG. 2(A) and FIG. 2(B), there is shown a schematic diagram depicting an illustrative PLC tunable reflector including two cascaded tunable resonators according to an aspect of the present disclosure. As may be observed from FIG. 2(B), tunable reflector 200 includes input port 215, output port 225, input waveguide 210, output waveguide 220 and resonant mirror assembly 250. Input waveguide 210 and output waveguide 210 are optically coupled to resonant mirror assembly 250 by couplers 230-1 and 230-2, respectively. Individual phase shifters are shown with respect to the input waveguide 210 and bus waveguide 240.

As may be readily understood from FIG. 2(B), input waveguide 210 receives input light 291 at input port 215 and provides reflected light 293 to that same port. Output waveguide 220 provides output light 292 at output port 225.

Operationally—and as will be appreciated by those skilled in the art—tunable reflector 200 receives input light 291 and controls the wavelength(s) of reflected light signal(s) 293, as well as distribution of light in transmitted light signal 292 and reflected light signal 293.

Resonant mirror structure 250 exhibits a controllable reflectivity and is operatively coupled between input waveguide 210 and output waveguide 220. Resonant mirror structure 250 is shown including a number of ring resonators namely, R1, and R2 and bus waveguides 240, 260 and 280. As generally depicted in FIG. 2—and as will be readily understood by those skilled in the art—a ring resonator (optical ring resonator) is a set of waveguides in which at least one is a closed loop coupled to some light input and output which may be—but are not limited to being—waveguides. Notably, while the ring resonators R1 and R2 are shown as "single ring" structures, those skilled in the art will appreciate that the specific structures of individual resonators may differ from those shown, i.e., "double" or "multi-ring" resonator structures, or resonator structures exhibiting different radii from those depicted in the figure or one another. Additionally—and as previously noted generally with respect to FIG. 1—specific configurations may include a different number of resonator structures and different number of bus waveguides and other structures (including any optional phase shifter(s) in the bus or input or other waveguides) which are included in a particular, overall resonant mirror structure.

Operationally, resonant mirror structure 250 reflects wavelengths in input light 291 back to input port 215 as a function of collective resonance(s) of ring resonators R1 and R2 that are included in resonant mirror structure 250. As will be understood by those skilled in the art, resonant mirror structure 250 is analogous to ring resonator-based mirrors described in U.S. Pat. No. 7,835,417 which is incorporated herein by reference as if set forth at length however, resonant mirror structure 250 exhibits additional functionality in that it is operable for controlling the amount of optical power reflected to input port 215 and conveyed to output port 225. Notably, and as will be further understood by those skilled in the art, resonant mirror structure 250 reflects a plurality of wavelength components which are separated by the free-spectral range (FSR) of the composite resonant structure. Advantageously, the wavelengths reflected may be tuned anywhere within the spectral range represented by this FSR.

As previously noted, input waveguide 210 and output waveguide 220 are optically coupled to resonant mirror assembly 250 by couplers 230-1 and 230-2. As depicted in FIG. 2, couplers 220-1 and 220-2 are a known type of coupler namely, "Y" couplers as they are known in the art and may be advantageously fabricated using conventional, integrated optics techniques and methods. As shown in FIG. 2, coupler 230-1 optically couples input waveguide 210 equally (50:50) with bus waveguides 240 and 260. As a result, input light 291 is split substantially equally into the two bus waveguides 240 and 260. Additionally—and while not specifically shown in FIG. 2—it is noted and understood that in certain implementations it may be desirable to optically couple input waveguide 210 to bus waveguides 240 and 260 using other structures such as a directional coupler.

Similarly, coupler 230-2 may be a conventional integrated-optics Y-coupler that optically couples bus waveguides 240 and 280 to output waveguide 220 such that light traversing the bus waveguides is combined to form output light 292. Again, it is noted that in certain implementations it may be desirable to optically couple output waveguide 220 to bus waveguides 240 and 280 using other structures such as a directional coupler.

Each of the ring resonators R1 and R2 may advantageously be formed as an integrated-optics waveguide ring that is optically coupled to a pair of bus waveguides. The individual resonance(s) of resonators R1 and R2 may be advantageously controlled individually by respective phase shifters 270-1 and 270-2. Note further that while phase shifters 270-1, and 270-2 are depicted in FIG. 2 as extending completely over respective resonator(s), phase shifters employed in a particular configuration may or may not so extend.

Notably, while this illustrative embodiment shown in FIG. 2 employs ring resonators that—in conjunction with waveguides and couplers—collectively define resonant mirror structure 250, those skilled in the art will readily understand and appreciate that alternative resonant structures may be employed including—but not limited to—cascaded resonant structure(s) having at least one alternative tunable resonant element for example, a tunable optically resonant cavity, a tunable coupled-cavity filter, and the like.

We additionally note that while coefficient K may be defined over a range of $0 \leq K \leq 1$, structures according to the present disclosure will preferably exhibit a range of $0.05 \leq K \leq 1$. With structures exhibiting two individual resonator structures and characterized by coefficients K1, K2, K3, and K4 such as that shown in FIG. 2, it is generally preferable to configure it such that at least three of the coefficients (i.e., K2, K3, and K4) are substantially equal to one another while the fourth (i.e., K1) is different (greater or lesser) than the other three (i.e. K2=K3=K4 and K1≠K2; K1≠K3; and K1≠K4; or K1=K3=K4 and K2≠K1; K2≠K3; and K2≠K4) By choosing an appropriate combination of coupling coefficients K1 through K4, the overall reflectance and transmittance of resonant mirror structure 250 may be selectively controlled. As noted previously—according to the present disclosure—at least one of the coefficients is different in value from the others which are all the same value.

Figure 3:
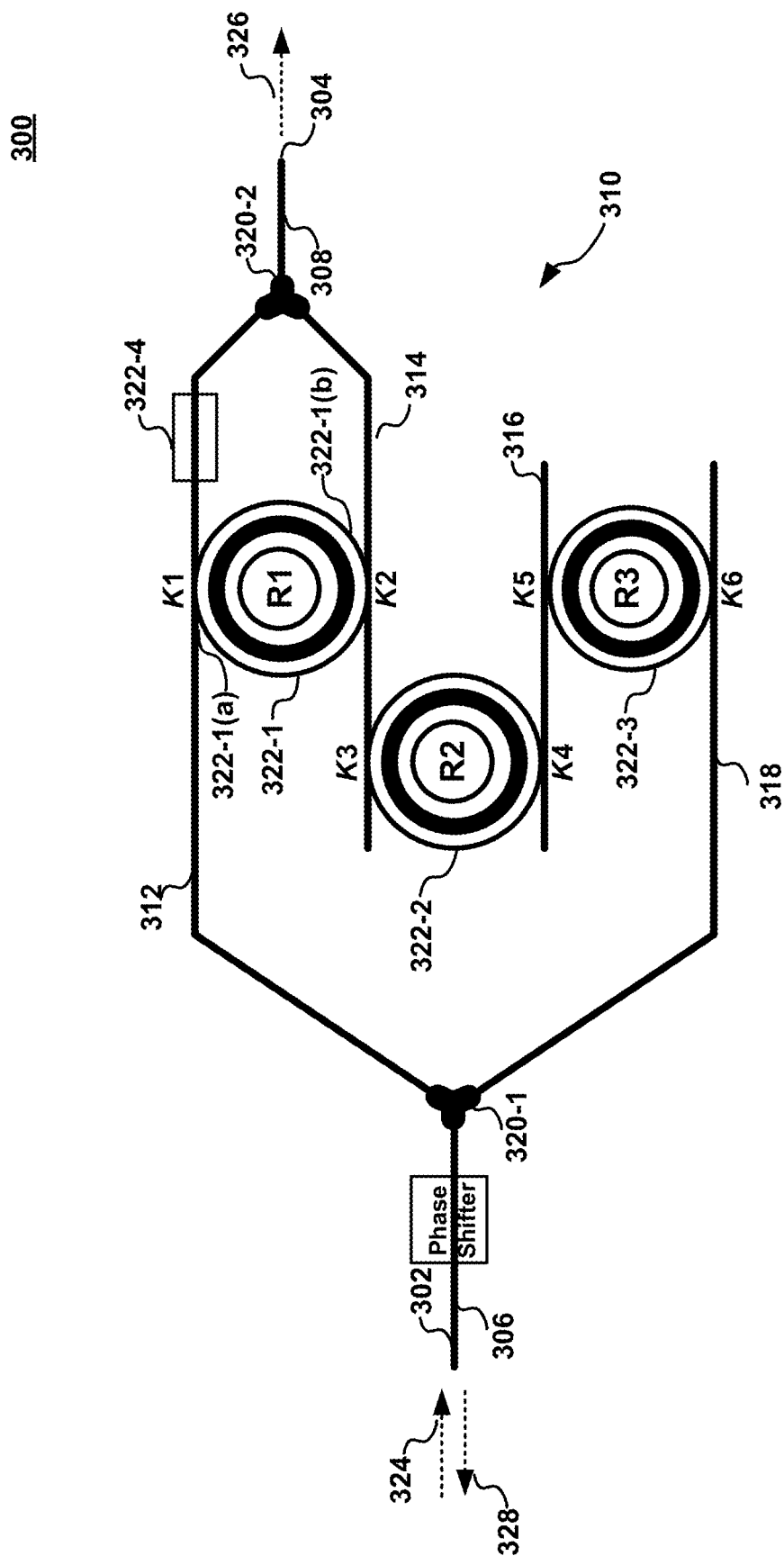
FIG. 3 depicts a schematic diagram of another alternative illustrative PLC tunable reflector including three cascaded tunable resonators according to an aspect of the present disclosure.

Turning now to FIG. 3, there is shown a schematic diagram depicting an illustrative PLC tunable reflector including cascaded three tunable resonators according to an aspect of the present disclosure. As may be observed from FIG. 3, tunable reflector 300 includes input port 302, output port 304, input waveguide 306, output waveguide 308 and resonant mirror assembly 310. Input waveguide 306 and output waveguide 308 are optically coupled to resonant mirror assembly 310 by couplers 320-1 and 320-2, respectively.

As may be readily understood from FIG. 3 and similar to that previously described—input waveguide 306 receives input light 324 at input port 302 and provides reflected light 328 to that same port. Output waveguide 308 provides output light 326 at output port 304.

Operationally—and as will be appreciated by those skilled in the art—tunable reflector 300 receives input light 324 and controls the wavelength(s) of reflected light signal(s) 328, as well as distribution of light in transmitted light signal 326 and reflected light signal 328.

Advantageously, waveguides employed in tunable reflector 300 may be any of a variety of known integrated optical waveguides suitable for use in PLC structures. Of further advantage, waveguides employed in tunable reflector(s) according to the present disclosure such as that shown in FIG. 3, as may include multi-core waveguides.

Resonant mirror structure 310 exhibits a controllable reflectivity and is operatively coupled between input waveguide 306 and output waveguide 308. Resonant mirror structure 310 is shown as a coupled-cavity resonator that includes a number of ring resonators namely, R1, R2, and R3 and bus waveguides 312, 314, 316, and 318. As generally depicted in FIG. 3—and as will be readily understood by those skilled in the art—a ring resonator (optical ring resonator) is a set of waveguides in which at least one is a closed loop coupled to some light input and output which may be—but are not limited to being—waveguides. Notably, while the ring resonators R1, R2, and R3 are shown as "single ring" structures, those skilled in the art will appreciate that the specific structures of individual resonators may differ from those shown, i.e., "double" or "multi-ring" resonator structures, or resonator structures exhibiting different radii from those depicted in the figure or one another.

Operationally, resonant mirror structure 310 reflects wavelengths in input signal 324 back to input port 302 as a function of collective resonance of ring resonators R1, R2, and R3 that are included in resonant mirror structure 310. As will be understood by those skilled in the art, resonant mirror structure 310 is analogous to ring resonator-based mirrors while exhibiting additional functionality in that it is operable for controlling the amount of optical power reflected back to input port 302 and transmitted to output port 304. Resonant mirror structure 310 reflects a plurality of wavelength components which are separated by the free-spectral range (FSR) of the composite resonant structure and may advantageously be tuned anywhere within the spectral range represented by the FSR.

As previously noted, input waveguide 306 and output waveguide 308 are optically coupled to resonant mirror assembly 310 by couplers 320-1 and 320-2 that are illustratively depicted as Y-couplers that may be advantageously fabricated using conventional, integrated optics techniques and methods. As shown in that Figure, coupler 320-1 optically couples input waveguide 306 equally (50:50) with bus waveguides 312 and 318. As a result, input light 324 is split substantially equally into the two bus waveguides 312 and 318. Additionally—and while not specifically shown in FIG. 3—it is noted that in certain implementations it may be desirable to optically couple input waveguide 306 to bus waveguides 312 and 318 using other structures such as a directional coupler or other couplers exhibiting different splitting ratios. When such directional coupler(s) are used as replacement for one or both couplers 320-1, 320-2 improved transmittance through overall reflector structure may advantageously be achieved.

Similarly, coupler 320-2 may be a conventional integrated-optics y-coupler that optically couples bus waveguides 312 and 314 to output waveguide 308 such that light traversing the bus waveguides is combined to form output light 326. Again, it is noted that in certain implementations it may be desirable to optically couple output waveguide 308 to bus waveguides 312 and 314 using other structures such as a directional coupler.

Each of the ring resonators R1, R2, and R3 may advantageously be formed as an integrated-optics waveguide ring that is optically coupled to a pair of bus waveguides. The individual resonance(s) of resonators R1, R2, and R3 may be controlled respectively by phase shifters 322-1, 322-2, and 322-3. Note further that while phase shifters 322-1, 322-2, and 322-3 are depicted in FIG. 3 as extending completely over respective resonator(s), phase shifters employed in a particular configuration may or may not so extend.

By way of illustrative example only, phase shifters employed may extend over only a portion of respective ring resonator(s) and advantageously enable separate control of coupling coefficients for a ring and its associated bus waveguides. As a further illustrative example, ring resonator R1—shown operatively coupled with phase shifter 322-1 in FIG. 3—may include independent portions such that independent control of coupling coefficients K1 (shown between ring R1 and bus waveguide 312 in FIG. 1) and K2 (shown between ring R1 and bus waveguide 314 in FIG. 3) may be controlled by—for example—phase shifter portion 322-1(*a*) and 322-1(*b*), respectively. Similar independently controllable structures may be employed in any or all of the individual resonators as desired.

Notably, while this illustrative embodiment shown in FIG. 3 employs ring resonators that—in conjunction with waveguides and couplers—collectively define resonant mirror structure 310, those skilled in the art will readily understand and appreciate that alternative resonant structures may be employed including—but not limited to—cascaded resonant structure(s) having at least one alternative tunable resonant element for example, a tunable optically resonant cavity, a tunable coupled-cavity filter, and the like may be employed as well.

With this illustrative, overall structure described, those skilled the art will understand that each of the ring resonators R1, R2, and R3 is characterized by a quality factor (i.e., "Q" factor) that may advantageously be controlled or otherwise influenced by its respective heater(s) or portions. By choosing an appropriate combination of coupling coefficients K1 through K6, the overall reflectance and transmittance of resonant mirror structure 310 may be selectively controlled.

Continuing with our discussion of FIG. 3, it may be observed that phase shifter 322-4 is operatively coupled to bus waveguide 312 such that it may operate as a phase shifter for light traversing the bus waveguide resulting in a positive coherent superposition of the light in the bus waveguide. In alternative embodiment(s), phase shifter 322-4 may be operatively coupled to bus waveguide 314 or—in a further alternative embodiment—a similar phase shifter(s) may be operatively coupled to both waveguides 312, 314 and/or other waveguide(s) as desired and/or necessary such that independent control of the phase of light in individual waveguides is enabled. In still further illustrative embodiments, a different phase shifter/controller may be used to control the phase of light in one or more of the bus waveguides, such as stress-tuning elements described in U.S. patent application Ser. No. 14/580,831, filed Dec. 23, 2015, the entire contents of which is incorporated by reference as if set forth at length herein.

Figure 4:
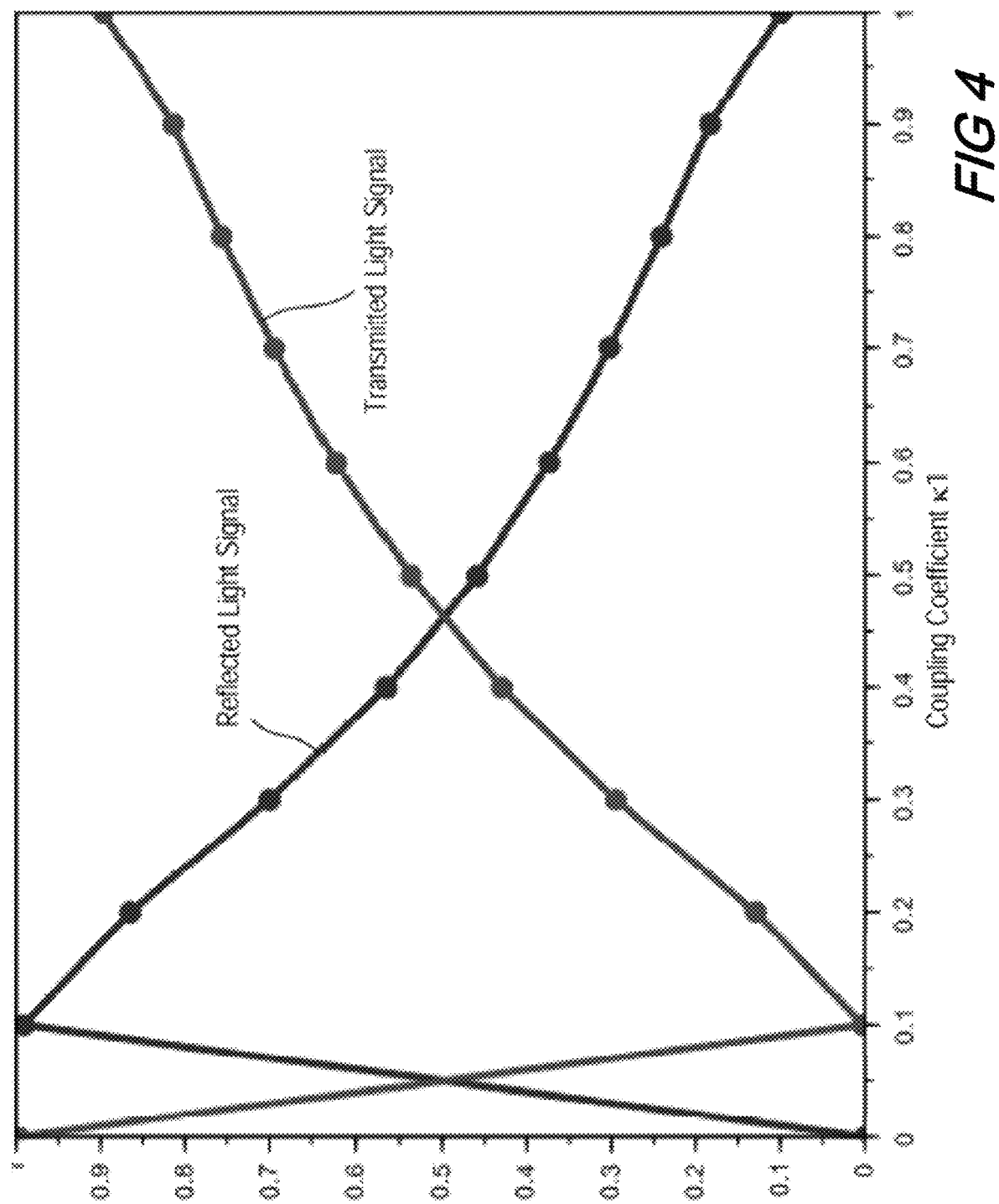
FIG. 4 depicts a plot of transmitted and reflected light as a function of coupling coefficients K1 through K6 according to an aspect of the present disclosure.

With reference now to FIG. 4, there is shown a plot of transmitted and reflected light for illustrative structures according to the present disclosure such as that depicted in FIG. 3 as a function of coupling coefficients K1 through K6. More particularly, the plot shown in FIG. 4 illustrates the effect(s) of tuning coefficient K1 from 0.0-1.0 while each of K2 through K6 is maintained at 0.1.

As should now be appreciated by those skilled in the art, structures and methods according to the present disclosure may be employed in a variety of useful system configurations. By way of illustrative example, FIG. 5 depicts an illustrative multi-port tunable reflector according to an aspect of the present disclosure.

Figure 5:
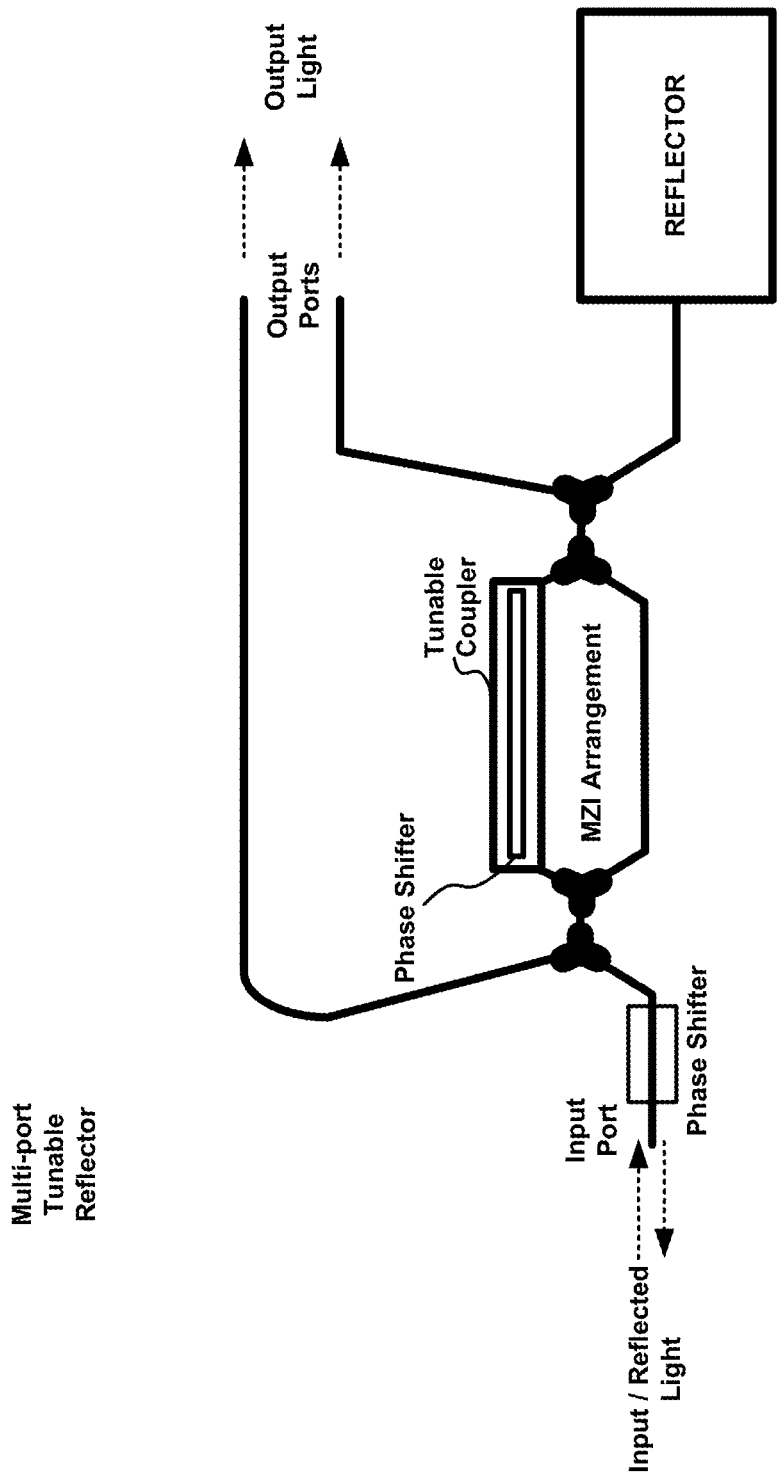
FIG. 5 depicts an illustrative multi-port tunable reflector according to an aspect of the present disclosure.

With reference now to FIG. 5, it may be observed that the multi-port tunable reflector includes a tunable reflector assembly according to the present disclosure such as that shown and described previously along with a tunable coupler configured as part of a Mach-Zehnder arrangement, an input port and a number of output ports. By including the tunable coupler between the input port and the reflector, the overall reflectivity and transmittance of the multi-port tunable reflector may be tunable from 0-100% and 100-0%, respectively. Inasmuch as the transmittance may be described by $T \in [0,1]$, the reflectivity is described by $(1-T)^2$ and the second output port will exhibit a lower output power as generally described by $(T-T)^2$, neglecting waveguide propagation loss.

Figure 6A:
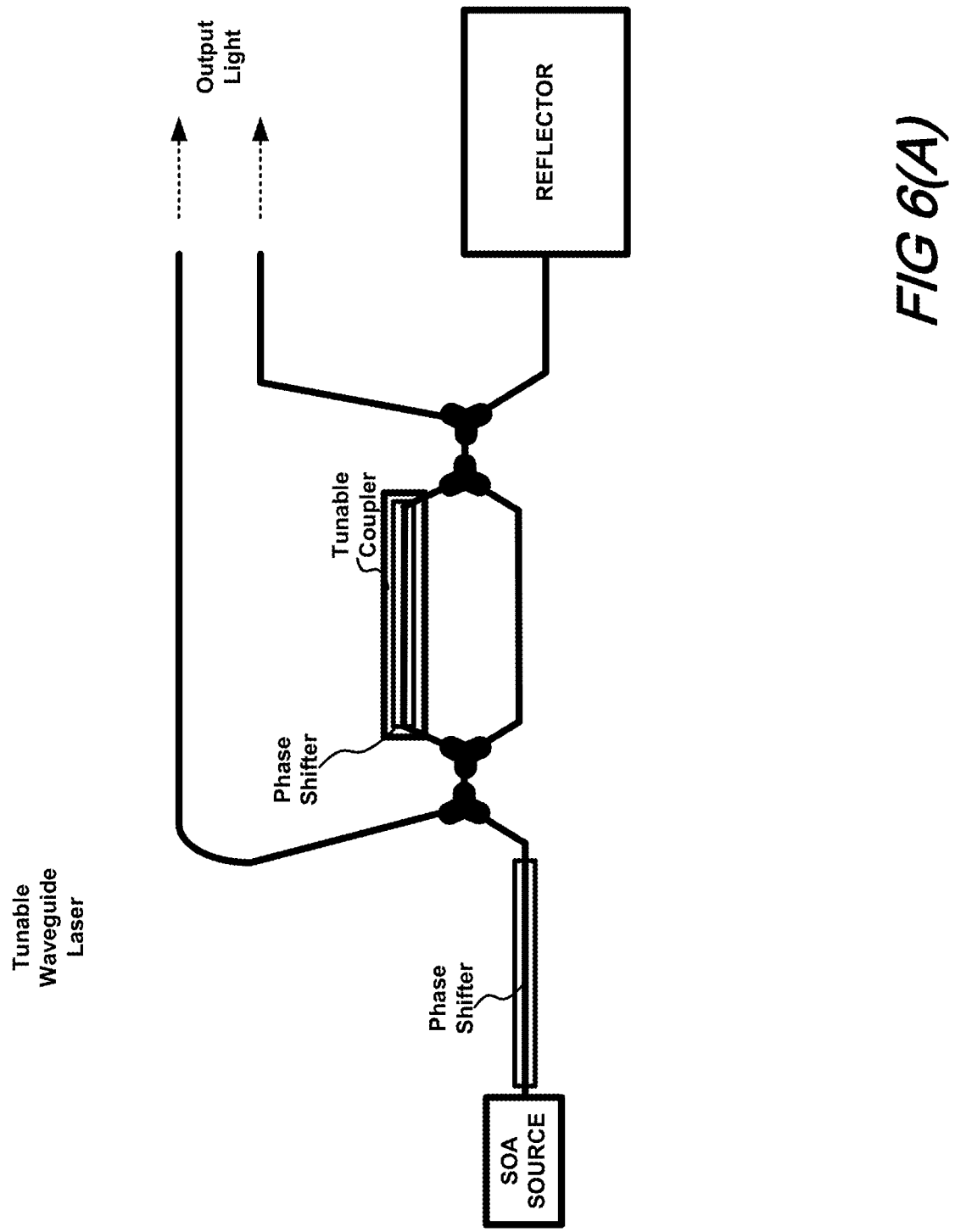
FIG. 6(A) depicts a schematic of an illustrative tunable waveguide laser according to an aspect of the present disclosure.

By way of yet another illustrative example, FIG. 6(A) depicts a schematic of an illustrative tunable waveguide laser according to an aspect of the present disclosure. Tunable waveguide laser includes a source, a tunable coupler and a tunable reflector according to the present disclosure.

Advantageously, source may include a semiconductor optical amplifier (SOA) having a gain section. In alternative configurations, source may be a different optical-gain element, for example an erbium-doped fiber amplifier, a semiconductor laser, or other, known, source elements. When configured as shown in FIG. 6(A), two output(s) are provided.

Figure 6B:
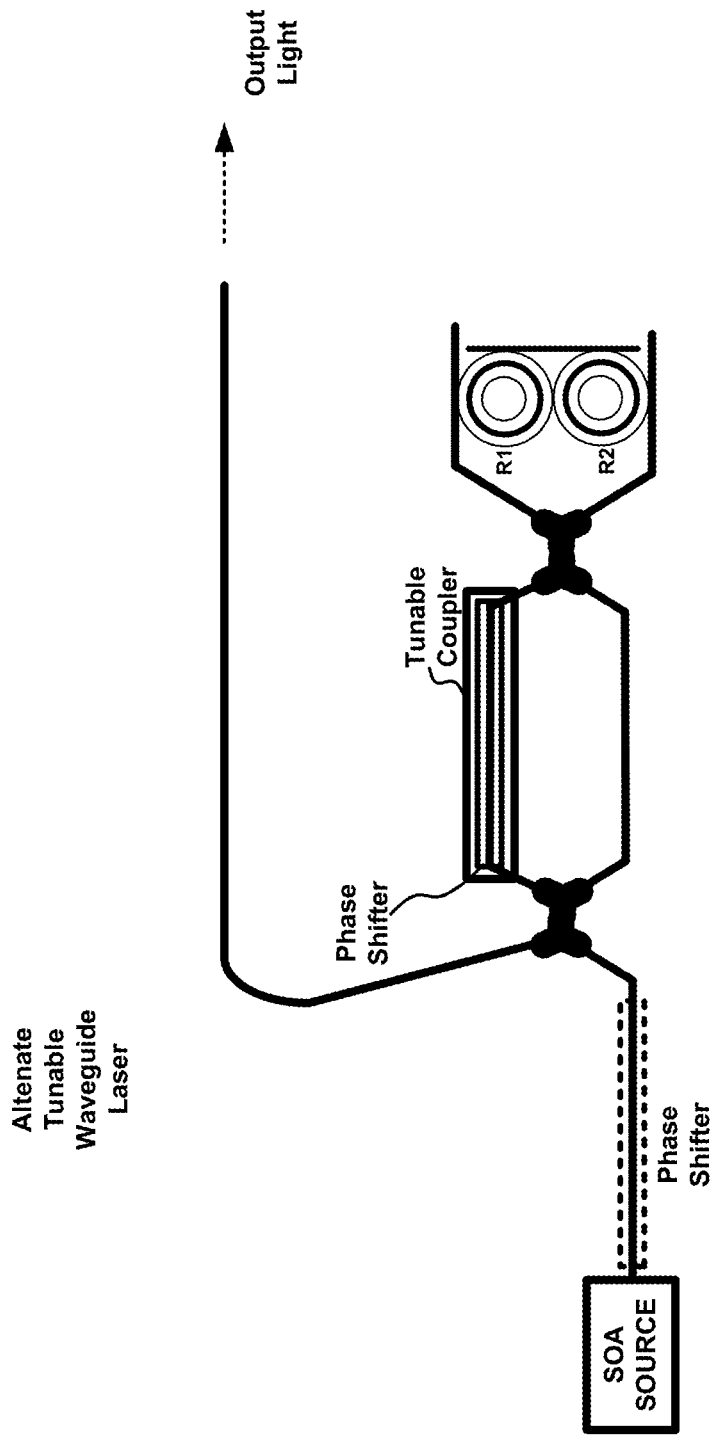
FIG. 6(B) depicts a schematic of an illustrative tunable waveguide laser according to an aspect of the present disclosure.

FIG. 6(B) depicts a schematic of an illustrative tunable waveguide laser according to an aspect of the present disclosure. With reference to that figure, it may be observed that an illustrative semiconductor optical amplifier is included in this illustrative arrangement which provides a single laser output. Also shown in this figure is an illustrative reflective mirror assembly including two resonator structures. When so configured, those skilled in the art will appreciate that the SOA and reflective mirror assembly operate as a tunable laser gain medium/cavity structure wherein the reflective mirror assembly serves as the mirror at a distal end of the cavity structure. As we shall show and describe, such structures may be advantageously extended to construct alternative laser configurations according to aspects of the present disclosure.

Figure 7A:
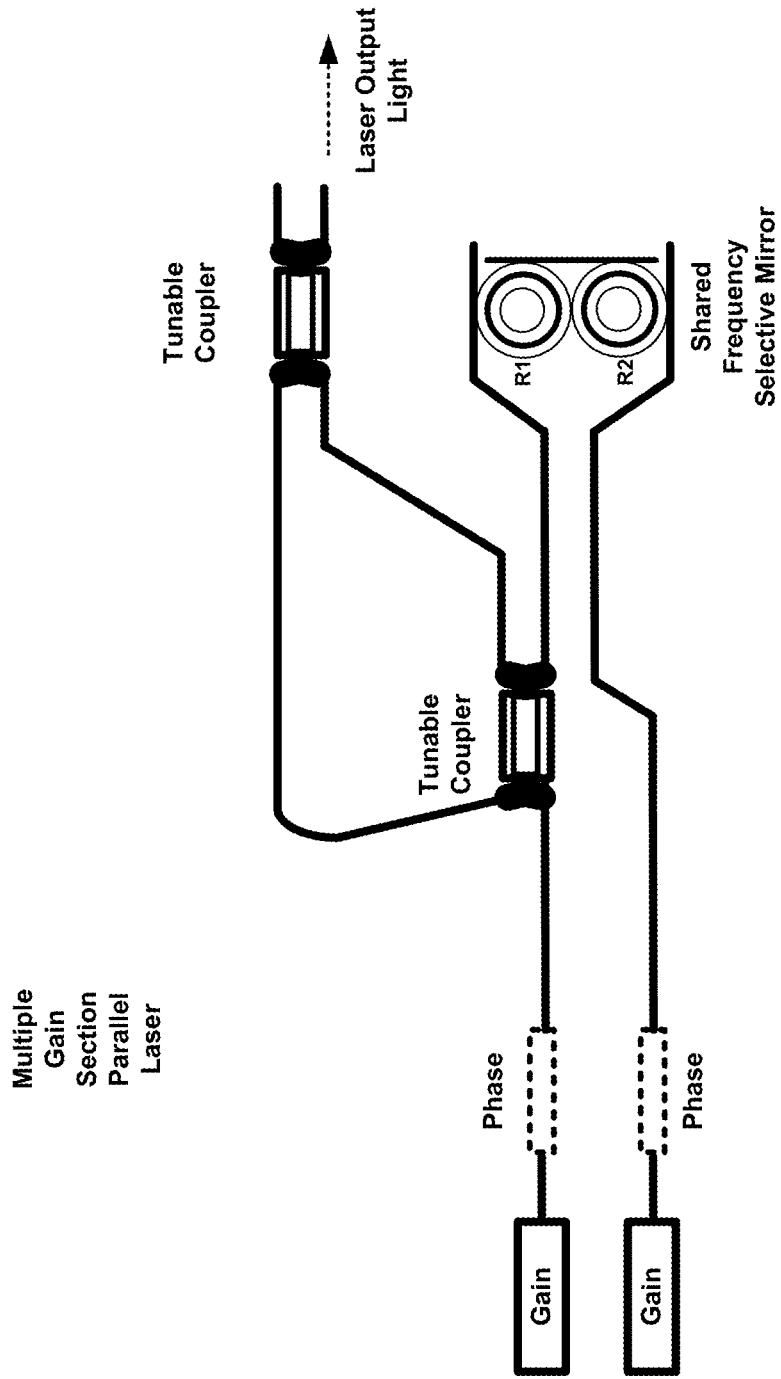
FIG. 7(A) depicts a schematic of an illustrative waveguide laser having a two gain sections/structures sharing a common frequency selective mirror according to an aspect of the present disclosure.

FIG. 7(A) depicts a schematic of an illustrative waveguide laser having a two gain sections/structures sharing a common frequency selective mirror according to an aspect of the present disclosure. As may be observed from that figure, a laser cavity is shown constructed from a gain section at a proximate end of the cavity, a phase shifter/adjuster, and a frequency selective mirror assembly at a distal end of the cavity. Shown further in this figure is a second cavity—sharing the same frequency selective mirror assembly as the other cavity—effectively creating a double-gain laser.

As will be understood by those skilled in the art, single-gain lasers are well known and exhibit a limited amount of output power due—in part—to saturation of the gain. In the inventive manner shown and described herein, adding multiple gain sections allows for higher output power. In fact, in the illustrative example shown, the two laser gain section may combine to provide substantially double the power of a single gain laser. As those skilled in the art will appreciate, such single gain lasers are oftentimes boosted by adding an SOA outside of the laser cavity to boost power—which unfortunately still results in limited output power as SOA optical saturation is still limiting output power. Still further, the SOA will add unwanted noise to output laser linewidth.

Figure 7B:
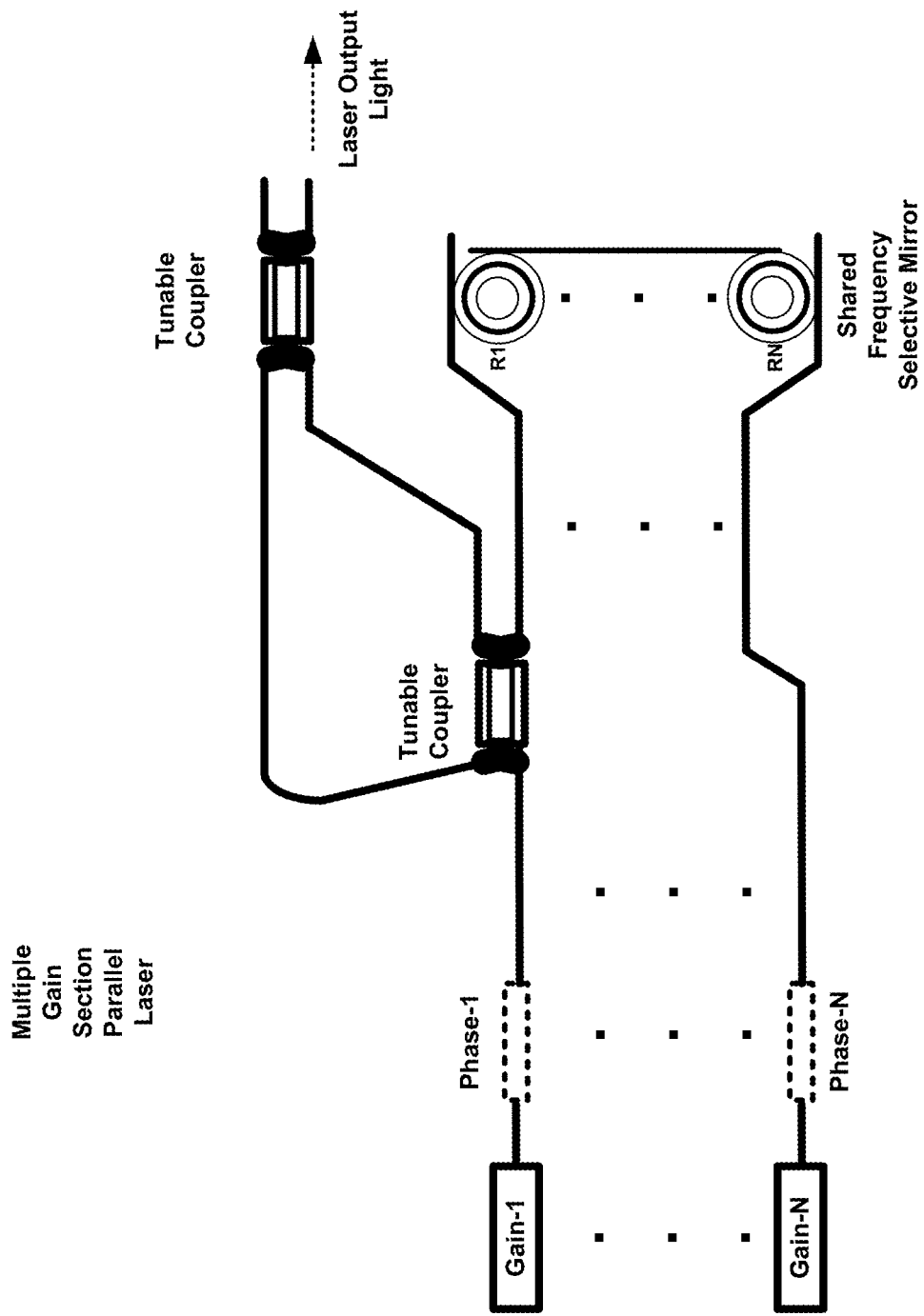
FIG. 7(B) depicts a schematic of an illustrative waveguide laser having N gain sections/structures sharing a common frequency selective mirror according to an aspect of the present disclosure.

FIG. 7(B) depicts a schematic of an illustrative waveguide laser having N gain sections/structures sharing a common frequency selective mirror according to an aspect of the present disclosure. Extending the innovative concept of FIG. 7(A), FIG. 7(B) shows a configuration in which N gain section/cavities are combined form an overall laser exhibiting substantially more output power than a single-gain structure. As with the structure shown in FIG. 7(A), the multiple-gain, parallel structure of FIG. 7(B) includes a shared frequency selective mirror assembly according to the present disclosure that forms a common end of each of the individual gain/cavity/resonator structures. In this inventive manner, a single, common, frequency selective mirror is employed for each individual laser cavity/resonator.

While not specifically shown in the figure, advantageously and surprisingly using the same frequency selective mirror for each cavity allows for extremely low linewidths with high output power(s). Of further advantage, a laser so constructed as shown in FIG. 7(A) or FIG. 7(B) is tunable, so it is quite suitable for applications requiring a large wavelength range—including those outside of those generally used for telecommunications applications and even those in the visible range(s).

Those skilled in the art will of course appreciate that structures constructed according to aspects of the present disclosure may advantageously employ integrated optics further providing more stable cavity(ies). Of particular interest, by using Silicon Nitride allows a high intra-cavity optical power that is magnitudes higher as compared to conventional, Si waveguides. Furthermore, by employing multiple gain sections that share a common frequency selective mirror, output power limitations that plagued the art with respect to single-gain lasers are overcome—particularly those limitations associated with gain saturation. Finally, SiN (i.e., TriPleX waveguides) allows for a very wide range of laser wavelengths and virtually any gain section in the range of 400-2100 nm may be advantageously combined into a multi-gain, parallel configuration according to the present disclosure.

At this point, while we have presented this disclosure using some specific examples, those skilled in the art will recognize that our teachings are not so limited and that various alternative configurations may be readily devised by those skilled in the art. Accordingly, this disclosure should be only limited by the scope of the claims attached hereto.

The invention claimed is:

1. A laser structure comprising:
a plurality of laser gain cavities sharing a single, resonant mirror assembly that forms a common end of the plurality of laser gain cavities such that the laser gain cavities are combined in parallel;
a plurality of phase shifters, each phase shifter of the plurality thereof being located within a different gain cavity of the plurality thereof; and
a tunable coupler that is optically coupled between a first gain cavity of the plurality thereof and the resonant mirror assembly.

2. The laser structure of claim 1 wherein the resonant mirror assembly is characterized by a free-spectral range, and wherein the resonant mirror assembly is tunable over any wavelength within the free-spectral range.

3. The laser structure of claim 1 further comprising a first phase shifter located within the first gain cavity of the plurality thereof.

4. A laser structure comprising:
a plurality of laser gain cavities sharing a single, resonant mirror assembly that forms a common end of the plurality of laser gain cavities such that the laser gain cavities are combined in parallel;
a plurality of optical-gain elements; and
a plurality of waveguides, each waveguide being an integrated-optics-based waveguide, wherein each waveguide of the plurality thereof is optically coupled between a different optical-gain element and the resonant mirror assembly.

5. The laser structure of claim 4 further comprising:
a first tunable coupler that is optically coupled between a first gain cavity of the plurality thereof and the resonant mirror assembly; and
a second tunable coupler that is optically coupled between the first tunable coupler and an output port at which the laser structure provides laser light.

6. The laser structure of claim 4 wherein at least one waveguide of the plurality thereof includes silicon nitride.

* * * * *